(12) United States Patent
Cohen et al.

(10) Patent No.: US 7,600,090 B2
(45) Date of Patent: Oct. 6, 2009

(54) MICROCONTROLLER BASED FLASH MEMORY DIGITAL CONTROLLER SYSTEM

(75) Inventors: Daniel Scott Cohen, Baltimore, MD (US); Mathew Todd Wich, Colorado Springs, CO (US); Jason Joseph Ziomek, Columbia, MD (US); Rocendo Bracamontes, Ellicott City, MD (US); Shude Lu, Woodstock, MD (US)

(73) Assignee: Atmel Corporation, San Jose, CA (US)

( * ) Notice: Subject to any disclaimer, the term of this patent is extended or adjusted under 35 U.S.C. 154(b) by 463 days.

(21) Appl. No.: 11/288,509

(22) Filed: Nov. 28, 2005

(65) Prior Publication Data

US 2008/0040580 A1     Feb. 14, 2008

(51) Int. Cl.
*G06F 12/00* (2006.01)

(52) U.S. Cl. ............... 711/167; 711/103; 711/154

(58) Field of Classification Search ............. None
See application file for complete search history.

(56) References Cited

U.S. PATENT DOCUMENTS

| | | | | |
|---|---|---|---|---|
| 5,072,418 | A * | 12/1991 | Boutaud et al. | 708/207 |
| 6,009,496 | A | 12/1999 | Tsai | 711/103 |
| 6,154,788 | A | 11/2000 | Robinson et al. | 710/8 |
| 6,246,634 | B1 * | 6/2001 | Nojima | 365/230.08 |
| 6,584,540 | B1 | 6/2003 | Shinmori | 711/103 |
| 6,658,578 | B1 * | 12/2003 | Laurenti et al. | 713/324 |
| 6,754,765 | B1 | 6/2004 | Chang et al. | 711/103 |
| 6,778,436 | B2 | 8/2004 | Piau et al. | 365/185.03 |
| 2003/0067814 | A1 | 4/2003 | Piau et al. | 365/189.05 |
| 2003/0079077 | A1 | 4/2003 | Piau et al. | 711/103 |
| 2003/0131185 | A1 | 7/2003 | Dover | 711/103 |
| 2004/0049627 | A1 | 3/2004 | Piau et al. | 711/103 |

FOREIGN PATENT DOCUMENTS

WO    WO-2007062256 A2    5/2007

OTHER PUBLICATIONS

"International Application Serial No. PCT/US2006/045564, Search Report mailed July 3, 2008", 7 pgs.
"International Application Serial No. PCT/US2006/045564, Written Opinion mailed July 3, 2008", 8 pgs.

* cited by examiner

*Primary Examiner*—Reginald G Bragdon
*Assistant Examiner*—Shawn X Gu
(74) *Attorney, Agent, or Firm*—Schwegman, Lundberg & Woessner P.A.

(57) ABSTRACT

A digital control system including a microcontroller for handling timed events, a command decoder for interpreting user commands, a separate burst controller for handling burst reads of the Flash memory, a program buffer for handling page writes to the Flash memory, a page transfer controller for handling data transfers from the Flash core to the program buffer as well as address control for page writes from the program buffer to the Flash memory, a memory control register block for storing and adjusting memory control and memory test mode signals, a memory plane interface for multiplexing addresses into the Flash memory and accelerating program, erase, and recovery verification, and an I/O Mux module for multiplexing data out of the system, and a general purpose I/O port (GPIO) that can be read and written by the microcontroller for use in test and debug.

29 Claims, 3 Drawing Sheets

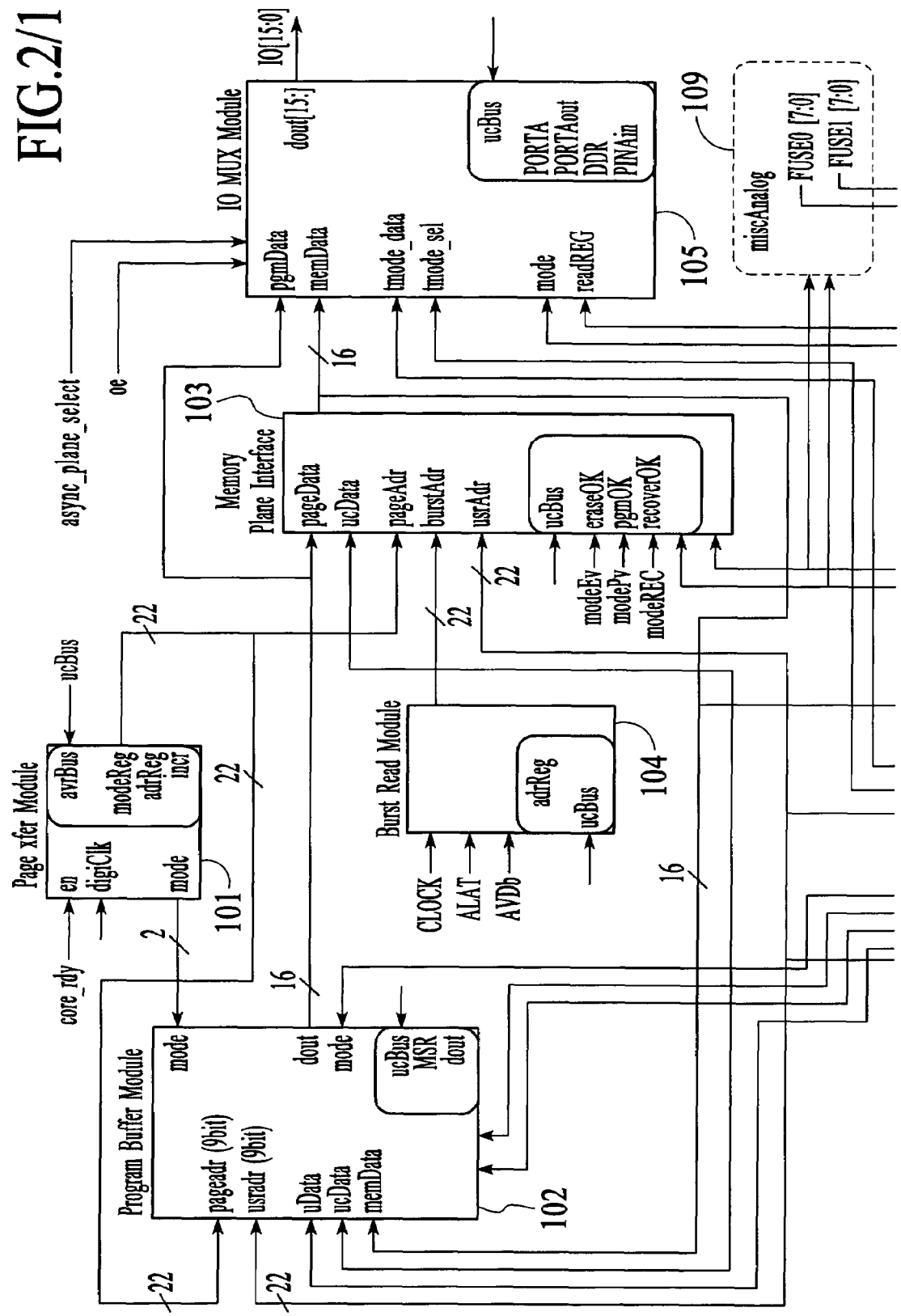
FIG.2/1

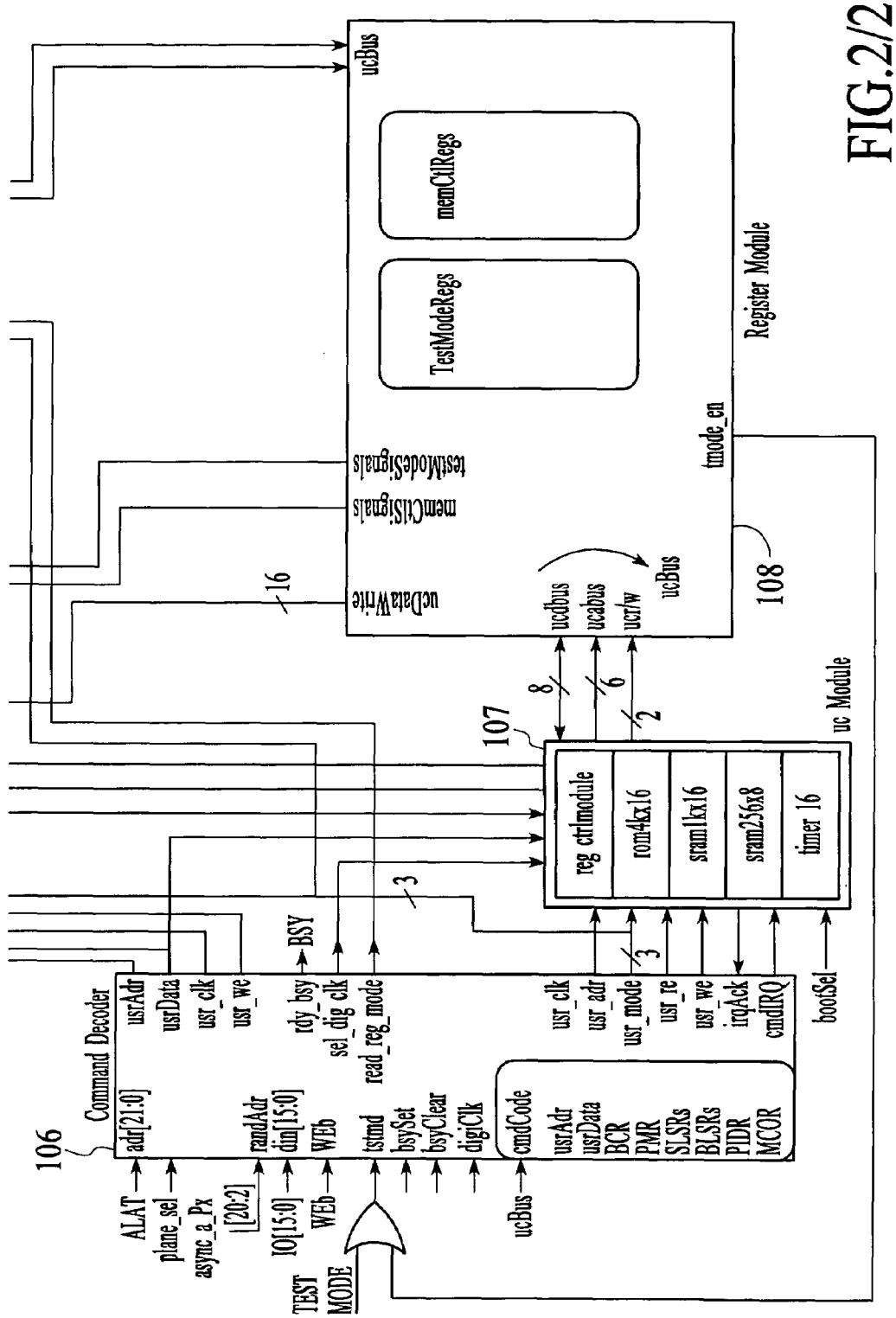
FIG.2/2

MICROCONTROLLER BASED FLASH MEMORY DIGITAL CONTROLLER SYSTEM

FIELD OF THE INVENTION

The present invention relates to Flash memory digital controller systems, and more particularly to microcontroller based flash memory digital controller systems.

BACKGROUND OF THE INVENTION

The use of a digital controller system for the storage and retrieval of digital information to and from a non-volatile Flash memory module is known in the art. However, conventional digital controller systems use hardwired state machines, which are inflexible. The state machine would require recoding for any change in the algorithm.

Accordingly, there exists a need for an improved digital controller system. The improved digital controller system should be based on a standard microcontroller coupled to a separate command decoder and burst read controller. The present invention addresses such a need.

SUMMARY OF THE INVENTION

A digital control system including a microcontroller for handling timed events, a command decoder for interpreting user commands, a separate burst controller for handling burst reads of the Flash memory, a program buffer for handling page writes to the Flash memory, a page transfer controller for handling data transfers from the Flash core to the program buffer as well as address control for page writes from the program buffer to the Flash memory, a memory control register block for storing and adjusting memory control and memory test mode signals, a memory plane interface for multiplexing addresses into the Flash memory and accelerating program, erase, and recovery verification, and an I/O Mux module for multiplexing data out of the system, and a general purpose I/O port (GPIO) that can be read and written by the microcontroller for use in test and debug.

BRIEF DESCRIPTION OF THE FIGURES

FIG. 2 illustrates in more detail the preferred embodiment of the digital controller system in accordance with the present invention.

DETAILED DESCRIPTION

Figure 1:
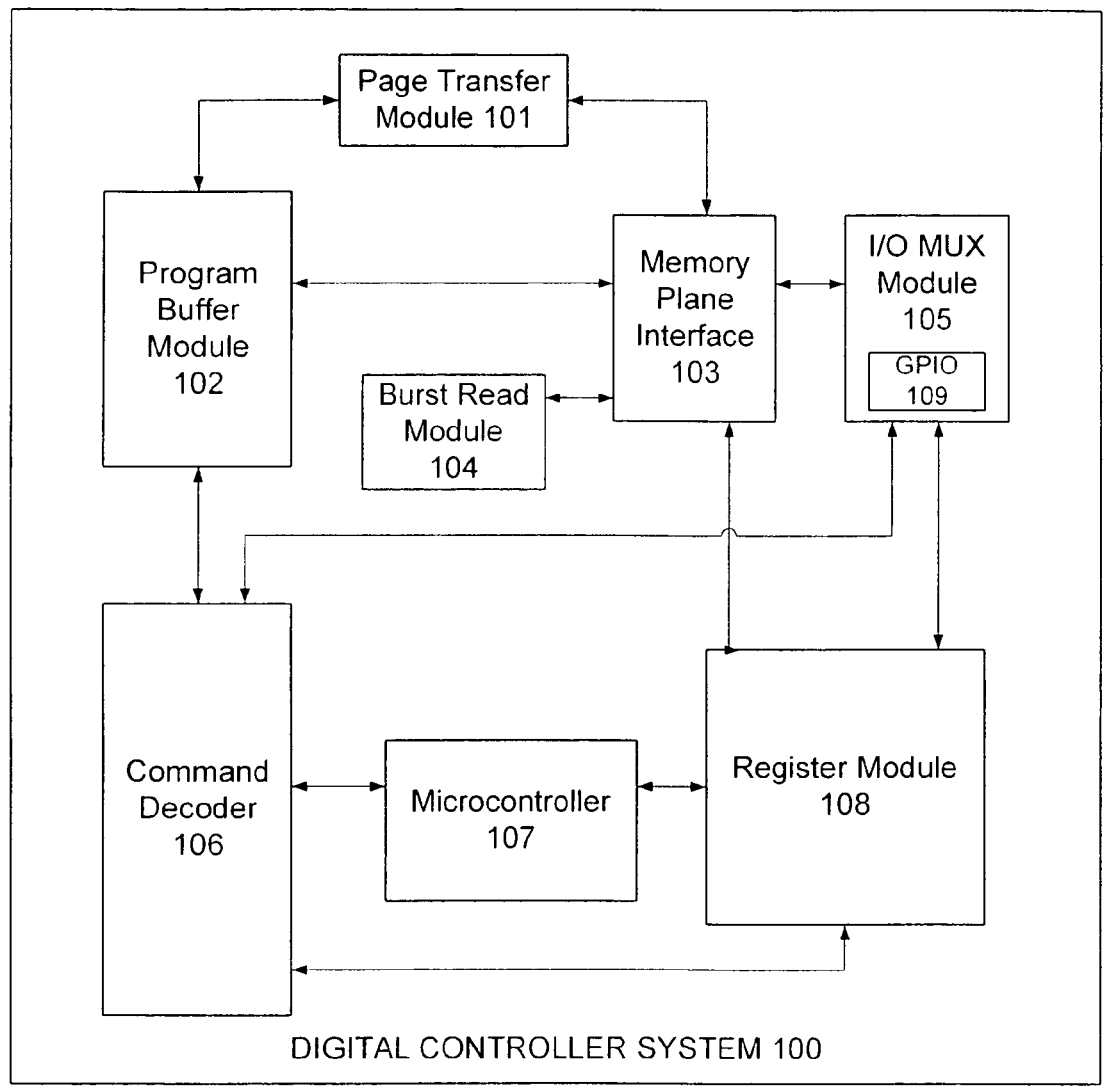
FIG. 1 illustrates a preferred embodiment of a digital controller system in accordance with the present invention.

The present invention provides a microcontroller based digital controller system. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

To more particularly describe the features of the present invention, please refer to FIGS. 1 through 2 in conjunction with the discussion below.

FIG. 1 illustrates a preferred embodiment of a digital controller system in accordance with the present invention. FIG. 2 illustrates in more detail the preferred embodiment of the digital controller system in accordance with the present invention. The digital controller system 100 comprises a microcontroller 107. Separately from the microprocessor 107, the digital controller system 100 comprises a page transfer module 101, a program buffer module 102, a memory plane interface 103, a burst read module 104, a input/output (I/O) multiplexer (MUX) module 105, a command decoder 106, and a register module 108, the functions of which are further described below.

In the preferred embodiment, the non-volatile Flash memory module can be embedded in or external to the digital controller system 100. Further in the preferred embodiment, the digital controller system 100 is built around a standard microcontroller system 107, but having additional "intelligence" built into the command decoder 106. The command decoder 106 serves to provide a means for detecting and managing user commands and waking up the microcontroller 107 when the command requires a complex "timed" command. The burst read module 104 provides a means of detecting a burst read request and responding accordingly. A "timed" command, as used in this specification, is a command which cannot be executed in one cycle, but rather requires a series of events to occur in order for the command to be fully executed. Examples of timed events include programming and erasing the Flash memory, setting or clearing non-volatile lock bits, page transfers from the Flash memory to the program buffer, and various test mode and extended commands. The use of a standard microcontroller 107 to handle timed events provide flexibility that is not offered by hardwired state machines. If the algorithm for interfacing to the Flash memory module needs to be tweaked, it can be done more readily by a simple mask change to the ROM that stores the microcontroller's firmware.

The Command Decoder

The command decoder 106 serves as a user interface, allowing commands to be received and managed independently of the microcontroller 107. The command decoder 106 serves as a "traffic cop" for the digital controller system 100 and acts on legal commands and ignores illegal ones. When a command is acted on, it is either done so solely by the command decoder 106 or by waking up the microcontroller 107. An example of a command not requiring the use of the microcontroller 107 is a read command, or write to the burst control register, or soft/hard lock registers. An example of a command requiring the use of the microcontroller 107 is a program or erase, or any other timed command.

Having a command decoder 106 separate from the microcontroller 107 providers several advantages:

(1) The microcontroller 107 can be turned off or put to sleep when there is no timed event underway. This saves power which is vital in low power battery operated systems.

(2) The microcontroller 107 need not be concerned with new commands, command prioritization, or management while it is working on a command. This provides code efficiency and allows for quicker processing of timed events which is crucial for quick programming and erasing of the Flash memory, a key metric of competitiveness.

(3) Interrupts are generated should an "erase suspend" command be issued while the microcontroller 107 is busy processing an erase command.

(4) The command clock is decoupled from the microcontroller clock, allowing the microcontroller 107 to run at a set speed asynchronously to the clock of the system 100 where the digital controller/Flash module will be used. This also allows quick responses to user commands even where multi-cycle timed events will occur. The ready signal can be dropped instantly by the command decoder 106 despite the fact that it could take some time for the microcontroller 107 to recognize the command.

(5) Software extendable commands are provided, whereby a single command called "the extended command" is interpreted along with an opcode that the command decoder 106 stores into a separate opcode register. When this command is received, the microcontroller 107 is awoken and knows to look at the opcode register. Depending on the value of the opcode, the firmware will adapt its behavior. By using an 8-bit opcode register, this method provides up to 256 additional commands.

(6) The microcontroller 107 serves as a test interface to the digital controller system 100 that provides for:

(a) User observability of the microcontroller's program counter (address counter) that can be used to determine what the microcontroller 107 is doing at any given time. This can be particularly helpful should the firmware hang or an intermittent bug occurs. This function is limited by the fact that it is ignored during boot (initialization). A means around this limitation is provided by firmware that polls an input during initialization to determine if the user wants to put the device to sleep.

(b) Access to all the registers on the microcontroller's data bus while the microcontroller 107 is asleep. This feature can be very useful in determining the state of the system 100 should a problem be detected. This is accomplished by having the command decoder 106 take control of the microcontroller's address and databus during a specific test mode. This mode can only be entered when the microcontroller 107 is asleep. This prevents any contention on the buses. A central bus multiplexing unit located in the block containing the microcontroller 107 outputs a single address bus and clock such that the registers on the bus needs not be aware that this debug mode exists. They simply respond to the clock and address as normal, not knowing whether the true source is the firmware acting through the microcontroller 107 or the user acting through the command decoder 106.

(c) Putting the microcontroller 107 to sleep should it be necessary to debug the state of the system 100 at any given time.

The Burst Read Module

The burst read module 104 contains a state machine for interpreting burst read commands, and counters for addressing the Flash memory, which serves to provide hardware acceleration for the burst read function. This is critical since the burst read function must operate at a significantly higher speed than normal asynchronous reads. The burst read module 104 also controls the initial access time of the burst read data by controlling the initial latency between the latching of the starting address and the raising of the data valid signal. This functionality creates a general purpose microprocessor interface to the Flash memory, preventing the microcontroller 107 from having to become involved in the read operation.

The burst read module 104 also prevents the burst address from entering a busy plane in the Flash memory by looking at a stop/busy signal and allowing the address counter to finish counting through the current 64-bits of data before stopping. In the preferred embodiment, the external interface to the user contains a 16-bit data word, however, to support high burst speeds, 64-bits are read at a time. While the four 16-bit words are being multiplexed out, the next 64 bits are being read. This eliminates the read latency after the initial latency and allows the burst function to operate at a higher data rate. The burst read module 104 also provides the burst enable signal and address to the memory plane interface 103, which in turn handles the multiplexing of the address into the Flash memory depending on the type of operation that is occurring. In the case of a burst read, the burst address will be multiplexed in.

Page Transfer Module

The page transfer module 101 contains a counter for addressing the Flash memory and the program buffer module 102. This provides hardware acceleration of the page transfer function, where a page of data is copied from the Flash memory to the program buffer module 102. By having its own counter and a microcontroller addressable "done" signal, the firmware can initiate a page transfer and then simply poll the "done" signal to know when the transfer has completed. This saves many cycles of firmware controlled address incrementation and data read/writes. Further, the program buffer module 102 pre-set function can be done quickly by setting a data register to a known value and then simply counting through the page address as the data register is written to all locations. This saves valuable code space and firmware developer effort.

Program Buffer Module

The program buffer module 102 contains a one page (4 Kbit or 256 16-bit words) byte addressable SRAM that serves as a page buffer for programming into the Flash memory. In the preferred embodiment, the program buffer module 102 has a logical size of 256×16 and is physically composed of two 256×8 bit SRAMs, making it possible to easily support byte addressing. It can be addressed by the user, by the command decoder 106, or by the firmware through the page transfer module's 101 address counter, allowing it to be read and written by both the user and the firmware. It also contains a status register that keeps track of which segment has been written to. In the preferred embodiment, there are 16 bits per word, 256 words per page and 32 words per segment. Therefore, there are 8 segments per page. The status register is 8 bits wide with each bit representing one of the 32 segments.

Memory Plane Interface

The memory plane interface 103 handles the multiplexing of address buses from different sources into the Flash memory module so that it can be accessed by the user (in the case of random reads), the burst read module 104 (in the case of burst reads), the firmware (for program and verify functions), and/or the page transfer module 101 (for copying data from the Flash memory to the program buffer) module 102. Separating the memory interface into its own hierarchical unit makes it possible to have a clean address interface that is optimized for performance by prioritizing the burst address bus for high speed reads and by making it easier to minimize skew on the address buses, which is critical for low power operation of the asynchronous Flash memory.

In addition, the memory plane interface 103 contains novel circuitry that performs the following three functions that serve as hardware accelerators to the program and erase functions:

(1) Program Okay Function: As data is stored into the Flash memory, it is simultaneously read back out and compared to the data that is being programmed. If the data does not match, a new pattern is generated that contains 0's only in the bit locations that need additional programming pulses. A bitwise AND of this pattern is assigned to a firmware readable register called "program_okay". If program_okay is LOW, then the new pattern must be programmed into the memory. If program_okay is HIGH, then no further programming is necessary.

(2) Erase Okay Function: A bitwise AND of the 64-bit data at the current address is stored in a firmware readable register called "erase_okay". Since an erased bit in the Flash memory is actually represented as a HIGH, this bit will indicate if all the bits in the 64 bit word are erased. A LOW value of erase_okay indicates to the firmware that additional erasing is necessary.

(3) Don't Recover Function:

(a) don't_recover_64 register: As noted previously, in the preferred embodiment, 64 bits (4 words) are read at a time. This allows the high speed burst read function to work. It should be noted that the 64 bit read is arbitrary and is only limited by the need for additional circuitry and power that would be required to read more bits at a time. When an erase is performed on a bit, it must be followed by a recover operation to ensure that the bit was not erased "too much". All over-erased bits must be recovered (soft programmed).

As firmware steps through addresses, the don't_recover_64 register will be set by hardware. A HIGH value indicates that no bits in the 64 bit slice are erased and therefore no recover (soft programming) is necessary. A LOW value indicates that at least one bit in the slice is in the erased state and therefore recovery is necessary. The firmware will then step through the addresses of the four 16-bit words that form this 64 bit slice and examine the don't_recover register to narrow down where to actually do the recovery.

(b) don't_recover register: Whereas the don't_recover 64 register is formed by examining the contents of a 64-bit slice, the don't_recover register is formed by just 16 bits. Because the smallest range of bits that can be recovered at a time is 16 bits, it is code and time efficient to further narrow down the 64 bit slice into 16-bit words and perform the recovery at this scope.

Register Module

The register module 108 contains registers whose values are loaded during the firmware initialization routine and whose purpose is to control or tweak various trim settings on the Flash memory and its analog support components. Various memory control signals are derived from individual bits or combination of bits in these registers. Some of these registers are for test while others are for normal operation. Examples include: enabling/disabling various steps during program and erase; trim values for various charge pumps used during read and program; oscillator frequency trim; and bandgap trim for controlling analog voltage regulation.

The register module 108 also contains some status registers or flags that are used by the firmware. These include the "error bit" that is set when a programming or erase error occurs, the suspend status register which indicates if an erase command has been suspended, and the "POR_init" register which indicates a Power On Reset has occurred.

The POR_init bit offers the advantage of allowing the firmware to make a decision as to whether the part is powering up in which case a full initialization is necessary, or whether the reset has occurred simply from a user initiated reset in which a significantly shorter initialization routine is used. This allows for faster boot up making a more competitive device.

The suspend status register offers advantages for the erase suspend and erase resume operations. Since an erase command involves many steps depending on the size of the data being erased, it is advantageous to keep track of how far along in the sequence the command has progressed so that if it is interrupted by a suspend command, the firmware can later know where to pick up again when the command is resumed. The 8-bit suspend status register serves this purpose. As the firmware progresses through an erase command, it keeps track of each step in the SSR. When an erase resume command is issued, the firmware looks at the SSR to know what has already been done so that it needn't re-run completed steps. The POR_init and error bit registers are cleared by signals from the command decoder 106.

I/O Mux Module

The I/O Mux module 105, accessible by the firmware, multiplexes data out of the system 100. It comprises a general purpose I/O (GPIO) 109 which provides advantages during debug and evaluation. In the preferred embodiment, a four bit I/O is used due to size limitations on the die that didn't allow enough space for a full 8 bit I/O that would have matched the microcontroller's data bus. However, firmware can output the first four bits of the bus and then the next four bits on a separate cycle. The I/O is bi-directional and can be used by the firmware to read as well as write. Since the system 100 has a special instruction SRAM for running firmware out of RAM instead of ROM during debug and evaluation, the firmware can be modified as necessary during debug of firmware or hardware. The GPIO 109 can be of immense help during this process.

An improved digital control system has been disclosed. The system comprises multiple subsystems including a microcontroller for handling timed events, a command decoder for interpreting user commands, a separate burst controller for handling burst reads of the Flash memory, a program buffer for handling page writes to the Flash memory, a page transfer controller for handling data transfers from the Flash core to the program buffer as well as address control for page writes from the program buffer to the Flash memory, a memory control register block for storing and adjusting memory control and memory test mode signals, a memory plane interface for multiplexing addresses into the Flash memory and accelerating program, erase, and recovery verification, and an I/O Mux module for multiplexing data out of the system, and a general purpose I/O port (GPIO) that can be read and written by the microcontroller for use in test and debug.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A digital controller system comprising:
  a microcontroller, wherein the microcontroller is awoken when a command received by the system requires a timed command; and
  a hardware accelerator coupled to the microcontroller for processing the command, the hardware accelerator including a burst read module for interpreting burst read commands, wherein the burst read module is configured to control an initial access time of a burst read data by controlling an initial latency between a latching of a starting address and raising of a data valid signal.

2. The system of claim 1, wherein the microcontroller is configured to handle the timed command.

3. The system of claim 1, further comprising a command decoder for detecting and managing user commands, wherein the command decoder is configured to manage user commands independently of the microcontroller.

4. The system of claim 3, wherein the command decoder is configured to handle non-timed commands.

5. The system of claim 1, wherein the timed command comprises a command that cannot be executed in a single cycle and requires a series of events to occur in order for the timed command to be fully executed.

6. The system of claim 1, wherein the hardware accelerator comprises a module for providing hardware acceleration of a page transfer function.

7. The system of claim 6, wherein the module for providing hardware acceleration comprises:
a counter for addressing a Flash memory and a program buffer module; and
a signal to determine when a page transfer has completed.

8. The system of claim 1, wherein the hardware accelerator comprises:
a function for programming new patterns into memory;
a function for erasing a word; and
a function for managing over-erasure of bits.

9. The system of claim 1, further comprising a memory that serves as a page buffer for programming into a Flash memory.

10. The system of claim 1, further comprising an interface for handling a multiplexing of address buses from different sources into a Flash memory module.

11. The system of claim 1, further comprising module for controlling various trim settings on a Flash memory and its analog support components.

12. A digital controller system comprising:
a microcontroller, wherein the microcontroller is awoken when a command received by the system requires a timed command; and
a hardware accelerator coupled to the microcontroller for processing the command, the hardware accelerator including burst read module for interpreting burst read commands, wherein the burst read module is configured to prevent a burst address from entering a busy plane in a Flash memory by looking at a stop/busy signal and allowing an address counter to finish counting through a current data before stopping.

13. The system of claim 12, wherein the burst read module comprises a plurality of counters for addressing a Flash memory, and the burst read module is configured to provide hardware acceleration for a burst read function.

14. A digital controller system comprising:
a microcontroller, wherein the microcontroller is awoken when a command received by the system requires a timed command;
a hardware accelerator coupled to the microcontroller for processing the command and burst read module for interpreting burst read commands; and
a plurality of registers whose values are loaded during a firmware initialization routine, wherein the plurality of registers comprises:
an error bit for setting when a programming or an erase error occurs;
a suspend status register for indicating if an erase command has been suspended; and
a POR_init register for indicating a Power On Reset has occurred.

15. The system of claim 14, further comprising a module for multiplexing data out of a system.

16. The system of claim 15, wherein the module for multiplexing data comprises a general purpose input/output.

17. The system of claim 14, wherein the microcontroller is not custom designed for a system.

18. A digital controller system comprising:
a microcontroller, wherein the microcontroller is awoken when a command received by the system is associated with a timed command;
a hardware accelerator coupled to the microcontroller for processing the received command if the received command does not require the timed command, the hardware accelerator including a burst read module for interpreting burst read commands, wherein the burst read module is configured to prevent a burst address from entering a busy plane in a Flash memory by looking at a stop/busy signal and allowing an address counter to finish counting through a current data before stopping; and
a command decoder coupled to the microcontroller for detecting and managing user commands and for waking up the microcontroller when the received command is associated with the timed command, wherein the microcontroller is configured to handle the timed command, wherein the command decoder is configured to handle non-timed commands, and wherein the command decoder is configured to manage user commands independently of the microcontroller.

19. The system of claim 18, wherein the timed command comprises a command that cannot be executed in a single cycle and requires a series of events to occur in order for the timed command to be fully executed.

20. The system of claim 18, wherein the burst read module comprises a plurality of counters for addressing a Flash memory, and the burst read module is configured to provide hardware acceleration for a burst read function.

21. The system of claim 18, wherein the hardware accelerator comprises a module for providing acceleration of a page transfer function.

22. The system of claim 21, wherein the module for providing acceleration comprises:
a counter for addressing a Flash memory and a program buffer module; and
a signal to determine when a page transfer has completed.

23. The system of claim 18, wherein the hardware accelerator comprises:
a function for programming new patterns into memory;
a function for erasing a word; and
a function for managing over erasure of bits.

24. The system of claim 18, further comprising a memory that serves as a page buffer for programming into a Flash memory.

25. The system of claim 18, further comprising an interface for handling a multiplexing of address buses from different sources into a Flash memory module.

26. A digital controller system comprising:
a microcontroller, wherein the microcontroller is awoken when a command received by the system is associated with a timed command;
a hardware accelerator coupled to the microcontroller for processing the received command if the received command does not require the timed command, the hardware accelerator including a burst read module for interpreting burst read commands, wherein the burst read module is configured to control an initial access time of a burst read data by controlling an initial latency between a latching of a starting address and raising of a data valid signal; and
a command decoder coupled to the microcontroller for detecting and managing user commands and for waking up the microcontroller when the received command is associated with the timed command, wherein the microcontroller is configured to handle the timed command, wherein the command decoder is configured to handle non-timed commands, and wherein the command decoder is configured to manage user commands independently of the microcontroller.

27. A digital controller system comprising:
a microcontroller, wherein the microcontroller is awoken when a command received by the system is associated with a timed command;

a hardware accelerator coupled to the microcontroller for processing the received command if the command does not require the timed command;

a register module for controlling various trim settings on a Flash memory and its analog support components, wherein the register module comprises a plurality of registers whose values are loaded during a firmware initialization routine; and a command decoder coupled to the microcontroller for detecting and managing user commands and for waking up the microcontroller when the received command is associated with the timed command, wherein the microcontroller is configured to handle the timed command, wherein the command decoder is configured to handle non-timed commands, and wherein the command decoder is configured to manage user commands independently of the microcontroller, wherein the plurality of registers comprises:

an error bit for setting when a programming or an erase error occurs;

a suspend status register for indicating if an erase command has been suspended; and a POR_init register for indicating a Power On Reset has occurred.

28. The system of claim 27, further comprising a module for multiplexing data out of a system.

29. The system of claim 28, wherein the module for multiplexing data comprises a general purpose input/output.

* * * * *

UNITED STATES PATENT AND TRADEMARK OFFICE
CERTIFICATE OF CORRECTION

PATENT NO.          : 7,600,090 B2                                   Page 1 of 1
APPLICATION NO.  : 11/288509
DATED                    : October 6, 2009
INVENTOR(S)          : Daniel S. Cohen et al.

It is certified that error appears in the above-identified patent and that said Letters Patent is hereby corrected as shown below:

In column 7, line 43, in Claim 14, after "and" insert -- including a --.

In column 9, line 2, in Claim 27, after "the" insert -- received --.

Signed and Sealed this

Sixteenth Day of February, 2010

David J. Kappos
*Director of the United States Patent and Trademark Office*

UNITED STATES PATENT AND TRADEMARK OFFICE
CERTIFICATE OF CORRECTION

PATENT NO. : 7,600,090 B2
APPLICATION NO. : 11/288509
DATED : October 6, 2009
INVENTOR(S) : Cohen et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 775 days.

Signed and Sealed this

Fourteenth Day of December, 2010

David J. Kappos
*Director of the United States Patent and Trademark Office*